United States Patent
Shiono et al.

(10) Patent No.: US 6,844,632 B2
(45) Date of Patent: Jan. 18, 2005

(54) SEMICONDUCTOR PRESSURE SENSOR DEVICE PROTECTED WITH PERFLUOROPOLYETHER GEL

(75) Inventors: Mikio Shiono, Gunma-ken (JP); Kenichi Fukuda, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/614,983

(22) Filed: Jul. 9, 2003

(65) Prior Publication Data

US 2004/0021209 A1 Feb. 5, 2004

(30) Foreign Application Priority Data

Jul. 10, 2002 (JP) ........................................ 2002-201366

(51) Int. Cl.⁷ ............................................... H01L 23/29
(52) U.S. Cl. ...................... 257/788; 257/795; 257/787; 257/684; 257/687; 257/729
(58) Field of Search ................................ 257/788, 795, 257/787, 684, 987, 729, 789, 790, 414, 415, 417, 418

(56) References Cited

U.S. PATENT DOCUMENTS 6,111,221 A  *  8/2000  Miyakoshi et al. .......... 219/216
6,472,581 B1 * 10/2002  Muramatsu et al. .......... 602/41

FOREIGN PATENT DOCUMENTS

| JP | 2525433 B2 | 5/1996 |
| JP | 2001-99737 A | 4/2001 |
| JP | 2001-153746 A | 6/2001 |
| JP | 2001-304999 A | 10/2001 |
| JP | 2001-311673 A | 11/2001 |

* cited by examiner

*Primary Examiner*—Nathan J. Flynn
*Assistant Examiner*—Remmon R. Fordé
(74) *Attorney, Agent, or Firm*—Birch, Stewart, Kolasch & Birch, LLP

(57) ABSTRACT

In a semiconductor pressure sensor device comprising a housing (1) having a cavity (3), a semiconductor sensor chip (2) mounted within the cavity, leads (4) for conveying pressure detection signals, and bonding wires (6) electrically connecting the sensor chip and the leads, a sensitive portion (2a) of sensor chip (2), leads (4) and bonding wires (6) are covered with an electrically insulating fluorochemical gel material which has a penetration of 30–60 according to JIS K2220, a Tg of up to $-45°$ C., and a degree of saturation swelling in gasoline at $23°$ C. of up to 7% by weight. The sensor device is improved in operation reliability and durability life.

9 Claims, 1 Drawing Sheet

SEMICONDUCTOR PRESSURE SENSOR DEVICE PROTECTED WITH PERFLUOROPOLYETHER GEL

This invention relates to a semiconductor pressure sensor device in which a semiconductor sensor chip for detecting a pressure is mounted within a resinous housing, and the sensor chip and electrical connections are covered and protected with a fluorochemical material and which possesses improved operation reliability and durability life in an environment of gasoline vapor or corrosive gases.

BACKGROUND OF THE INVENTION

From the past, semiconductor pressure sensors are used for measuring the pressure of intake and exhaust gases in automotive engines, the pressure of exhaust gases in motorcycle engines, and the like. For instance, pressure sensors for measuring the engine intake pressure in automobiles generally use semiconductor pressure sensor chips utilizing piezoresistance effect as the pressure detecting device. Semiconductor pressure sensor chips of this type are designed to detect as an electrical signal a change of resistance in response to any deformation of a diaphragm made of piezoresistive material. The semiconductor pressure sensor has a semiconductor pressure sensor chip mounted within a cavity in a resinous housing. For example, the semiconductor pressure sensor chip is mounted within the housing cavity with the aid of an adhesive directly or after placement on a glass pedestal. Bonding wires are used to provide electrical connection between the sensor chip and leads which are embedded in the resinous housing by insert molding.

The semiconductor pressure sensors of this type are not only subject to varying pressure and varying temperature, but are also exposed to an environment of gasoline vapor, water vapor, acidic exhaust gases or the like. It is thus essential to fill and seal the cavity interior with an electrically insulating fluorochemical gel material for the purpose of protecting the semiconductor pressure sensors from electrical, mechanical, thermal and chemical attacks.

The semiconductor pressure sensors encapsulated and protected with fluorochemical gel materials include sensors using fluorosilicone gel materials as disclosed in Japanese Patent No. 2,525,433 and JP-A 2001-153746 and sensors using perfluoropolyether gel materials as disclosed in JP-A 2001-99737, JP-A 2001-153746, JP-A 2001-304999 and JP-A 2001-311673. Of these, JP-A 2001-153746 proposes the use of a gel material having a degree of saturation swelling in gasoline at 20° C. of up to 7 wt % and a penetration of 10 to 30 as measured by the consistency test of JIS K2220 using a ¼ cone, as a means of preventing bubbles from generating from within a gel material under negative pressure or at elevated temperature. Also, JP-A 2001-304999 proposes the use of a gel or rubber material having a glass transition temperature of up to −30° C., as a means of preventing degradation of sensor performance by an increased stress in a low-temperature environment and lowering of chemical resistance.

However, in the case of the above semiconductor pressure sensor encapsulated with a fluorochemical gel material having a low penetration as well as the above-described properties, the generation of bubbles from within the gel material can be restrained whereas the gel material will separate partially from the surface of gold-plated leads, the cavity wall of a resinous housing or the like, especially due to short adhesion of the gel material under negative pressure or at low temperature (below 0° C.). Then condensed liquid ingredients will accumulate at the separated portions, becoming a source of bubble generation. Bubbles generated therefrom will grow or travel with a change of temperature or pressure and cause cracking to the gel material or breakage to the bonding wires. Then not only the insulating/protecting function, but the sensor function itself is lost. On the other hand, even in the case of the semiconductor pressure sensor encapsulated with a fluorochemical gel material having a degree of saturation swelling in gasoline at 20° C. of up to 7 wt % and a Tg of up to −30° C., if the gel material has a high penetration, the gel material, when subjected to pressure cycling in a low-temperature state below 0° C. over a long period of time, undergoes initial bubble formation and eventual liquefaction, resulting in a portion thereof flowing out of the cavity and interfering with the insulating/protecting function.

SUMMARY OF THE INVENTION

An object of the present invention is to provide a semiconductor pressure sensor device encapsulated with a fluorochemical gel material for protection, having improved operation reliability and durability life in that bubble formation within the protective material is restrained under the service conditions that the sensor device is not only subject to a pressure or temperature change, but also exposed to an atmosphere of gasoline vapor, water vapor, acidic exhaust gases or the like.

The inventors discovered a fluorochemical gel material having a degree of saturation swelling in gasoline at 23° C. of up to 7% by weight and a glass transition temperature of up to −45° C., and studied the relationship of bubble formation and a liquefaction phenomenon to the hardness of the gel material. As a result, the inventors have found that when the gel material has a penetration of 30 to 60 as measured by the consistency test of JIS K2220 using a ¼ cone, it prevents the bubble formation due to shortage of adhesive strength and the liquefaction caused by bubble formation under pressure cycling at low temperatures (especially below 0° C.).

In a first aspect, the invention provides a semiconductor pressure sensor comprising a housing having a cavity, a semiconductor sensor chip mounted within the cavity for detecting a pressure to produce a signal, leads for conveying the signal, and bonding wires providing electrical connection between the sensor chip and the leads, wherein a sensitive portion of the sensor chip, the leads and the bonding wires are covered and protected with an electrically insulating fluorochemical gel material. The fluorochemical gel material has a penetration of 30 to 60 as measured by the consistency test of JIS K2220 using a ¼ cone, a glass transition temperature (Tg) of up to −45° C., and a degree of saturation swelling in gasoline at 23° C. of up to 7% by weight.

As long as the penetration of the gel material is within the above-defined range, the gel material is prevented from bubble formation due to shortage of adhesive strength at a negative pressure or a low temperature and bubble formation under pressure cycling at a low temperature. Since no bubbles generate in proximity to the portions covered with the fluorochemical gel material, specifically in proximity to the sensitive portion of the sensor chip, the bonding wires, and the connections between the bonding wires and the sensor chip or leads, the problem of degradation of insulating function or breakage of bonding wires caused by bubble formation is overcome.

The fluorochemical gel material which can be used herein is typically a cured product of a curable composition comprising a polymer of hexafluoropropylene oxide as a base polymer, preferably a curable composition comprising components (A) to (E):

(A) 100 parts by weight of a chain-like polyfluorodialkenyl compound having an alkenyl group at each end of a molecular chain and containing a backbone skeleton represented by the formula:

(B) 40 to 160 parts by weight of a chain-like polyfluoromonoalkenyl compound having an alkenyl group at one end of a molecular chain and containing a backbone skeleton represented by the formula:

(C) a fluorinated organosilicon compound having at least two hydrosilyl groups in a molecule, in an amount to give 0.8 to 1.2 equivalents of hydrosilyl groups based on the entire alkenyl groups in components (A) and (B), (D) a catalytic amount of a platinum group compound, and (E) up to 40 parts by weight of a non-functional perfluoropolyether per 100 parts by weight of components (A) and (B) combined.

The gel material has a glass transition temperature of −45° C. or lower (embrittlement temperature −20° C. or lower) and a degree of saturation swelling in gasoline at 23° C. of 7% by weight or less.

The Tg of the gel material can be lowered by selecting the type and amount of the non-functional perfluoropolyether (E). This further restrains the bubble generation due to shortage of adhesive strength at a negative pressure and a low temperature and the degradation of sensor characteristics by an increase of stress at a low temperature.

Where a resinous housing is molded over leads by an insert molding technique so that the leads are partially embedded in the housing, air trapped in voids between the housing and the leads can be drawn into the gel material during the application of heat or pressure, resulting in generation of bubbles within the gel material.

To restrain bubbles from generating by way of the above mechanism, a second aspect of the invention provides a semiconductor pressure sensor device comprising a housing having a cavity, a semiconductor sensor chip mounted within the cavity for detecting a pressure to produce a signal, leads embedded in the housing by insert molding for conveying the signal, and bonding wires providing electrical connection between said sensor chip and said leads, wherein at least the leads and surrounding portions are covered with an electrically insulating fluorochemical rubber material while a sensitive portion of the sensor chip is exposed, the fluorochemical rubber material and the sensitive portion of the sensor chip are covered with an electrically insulating fluorochemical gel material, and the bonding wires are covered with the fluorochemical rubber material and the fluorochemical gel material. The fluorochemical rubber material has a hardness of 5 to 35 according to JIS K6253, the fluorochemical gel material has a penetration of 30 to 60 as measured by the consistency test of JIS K2220 using a ¼ cone, the fluorochemical rubber material and the fluorochemical gel material both have a glass transition temperature (Tg) of up to −45° C. and a degree of saturation swelling in gasoline at 23° C. of up to 7% by weight.

The hardness of the fluorochemical rubber material is limited to the range of 5 to 35. A material with a hardness of less than 5 provides an insufficient effect of restraining bubble generation at a high temperature and negative pressure. A material with a hardness of more than 35 fails to follow a change of pressure or temperature so that it may separate from the surface to be covered or cause breakage to the bonding wires.

According to the invention, the fluorochemical rubber material covering the leads and adjacent portions is a material having a relatively high modulus of elasticity, which restrains generation of bubbles from voids between the housing and the leads. Since the sensitive portion of the sensor chip is covered with a fluorochemical gel material having a relatively low modulus of elasticity, the sensing function is not impaired.

A member through which the semiconductor sensor chip is mounted to the housing may also be covered with the fluorochemical rubber material. Then bubble generation from the mounting member is prevented.

In a preferred embodiment, the fluorochemical rubber material is a cured product of a curable composition comprising components (A), (C), (D), (E), (F) and (G), and the fluorochemical gel material is a cured product of a curable composition comprising components (A), (B), (C), (D) and (E):

(A) 100 parts by weight of a chain-like polyfluorodialkenyl compound having an alkenyl group at each end of a molecular chain and containing a backbone skeleton represented by the formula:

(B) 40 to 160 parts by weight of a chain-like polyfluoromonoalkenyl compound having an alkenyl group at either one end of a molecular chain and containing a backbone skeleton represented by the formula:

(C) a fluorinated organosilicon compound having at least two hydrosilyl groups in a molecule, in an amount to give 0.8 to 1.5 equivalents of hydrosilyl groups based on the entire alkenyl groups in components (A) and (B), (D) a catalytic amount of a platinum group compound, (E) up to 40 parts by weight of a non-functional perfluoropolyether per 100 parts by weight of components (A) and (B) combined, (F) 1 to 5 parts by weight of hydrophobic finely divided silica, and (G) 0.1 to 3.0 parts by weight of an organosilicon compound having at least one trialkoxysilyl and/or epoxy group in a molecule.

Like the fluorochemical gel material, the fluorochemical rubber material used herein can be a cured product of a curable composition comprising a polymer of hexafluoropropylene oxide as a base polymer. The rubber material has a Tg of −45° C. or lower (embrittlement temperature −20° C. or lower) and a degree of saturation swelling in gasoline at 23° C. of 7% by weight or less. Like the gel material, the Tg of the rubber material can be lowered by selecting the type and amount of the non-functional perfluoropolyether (E). The fluorochemical rubber material may further contain a carboxylic acid anhydride, and in this embodiment, the rubber material is more effective for restraining bubble generation from voids between the housing and the leads because the adhesive strength of the rubber material to any mating material is enhanced.

DESCRIPTION OF THE PREFERRED EMBODIMENTS

In the embodiments described below, the semiconductor pressure sensor device of the invention is described by referring to an application where an automotive engine intake air pressure is to be measured in an environment containing gasoline vapor, water vapor, exhaust gases, light oil and the like.

First Embodiment

Figure 1:
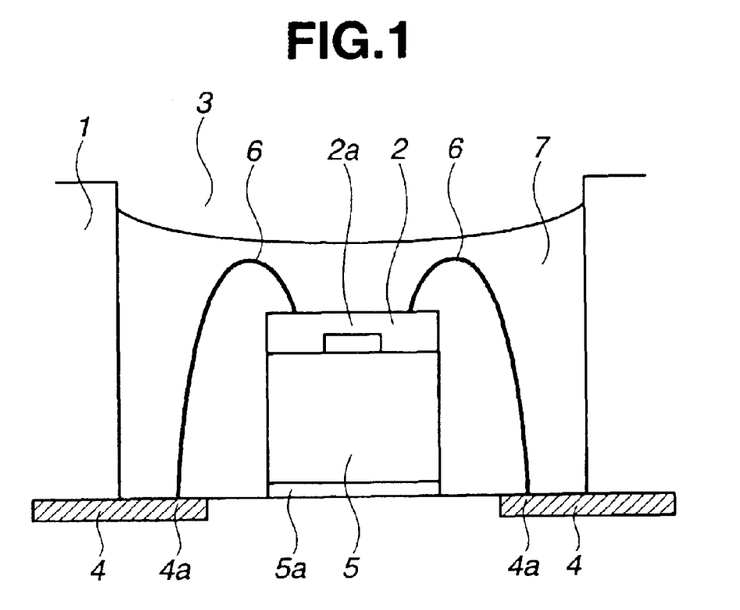
FIG. 1 illustrates an elevational cross-section of a semiconductor pressure sensor device according to a first embodiment of the invention.

Referring to FIG. 1, there is illustrated in elevational cross-section a semiconductor pressure sensor device according to the first embodiment of the invention. A resinous housing 1 is made of a filled resin such as an epoxy resin, polyphenylene sulfide (PPS) or polybutylene terephthalate (PBT) and defines a cavity 3 where a semiconductor sensor chip 2 is to be mounted.

The resinous housing 1 has been molded over a plurality of insert pins 4 (also referred to as "leads," herein) made of an electrically conductive material such as copper by an insert molding technique so that the insert pins 4 are embedded in the housing 1. Of the plurality of insert pins 4, four insert pins are located at the four corners of the cavity 3 at the bottom and exposed thereat within the cavity 3. The exposed portions of the insert pins 4 are plated with gold and serve as bonding pads 4a.

The semiconductor sensor chip 2 used herein is a sensor chip of well-known construction utilizing a piezoresistance effect and has at its top a diaphragm 2a serving as a sensitive portion, a diffused resistor (not shown) and the like.

The sensor chip 2 is die bonded to the bottom of the housing cavity 3 through a glass pedestal 5 using an adhesive layer 5a of a fluorosilicone or perfluoropolyether adhesive to be described later. Bonding wires 6 of gold, aluminum or the like electrically connect the sensor chip 2 to the bonding pads 4a of the insert pins 4.

The cavity 3 is filled with a gel material as a protective material 7 for providing protection, electrical insulation and anti-corrosion to the sensor chip 3 and the bonding wires 6 so that the sensor chip 2 and bonding wires 6 are buried in the protective material 7. The sensitive portion (including diaphragm 2a and diffused resistor) of the sensor chip 2, the bonding wires 6, the connections between the sensor chip 2 and the bonding wires 6, and the connections between the insert pins 4 and the bonding wires 6 are covered for protection with the protective material 7.

According to the invention, the gel material used as the protective material is a fluorochemical gel material having a penetration of 30 to 60 as measured by the consistency test of JIS K2220 using a ¼ cone, a Tg of up to −45° C., and a degree of saturation swelling in gasoline at 23° C. of up to 7% by weight.

The sensor device constructed as described above is installed on an automobile such that the cavity 3 is in fluid communication with an engine intake path. Then sensor device and the protective material are not only subject to changes of pressure and/or temperature, but also exposed to an atmosphere containing gasoline vapor, water vapor, acidic exhaust gases and the like. Since the gel-like cured product has a JIS K2220 (¼ cone) consistency test penetration of 30 to 60, a Tg of up to −45° C., and a degree of saturation swelling in gasoline at 23° C. of up to 7% by weight, it can prevent bubble generation caused by shortage of adhesive strength at a negative pressure or low temperature and bubble generation upon pressure cycling at a low temperature. Since no bubbles generate from areas in proximity to those portions covered with the gel material, namely in proximity to the sensitive portion of the sensor chip 2, bonding wires 6, and the connections between bonding wires 6 and sensor chip 2 or leads 5, the problem of lowering insulation function or breakage of bonding wires 6 is avoided. The sensor device insures high operation reliability.

For the gel material, the penetration is in the range of 30 to 60, preferably 30 to 50, the Tg is preferably in the range of −90° C. to −45° C., especially −90° C. to −50° C., and the degree of saturation swelling in gasoline is up to 7% by weight, preferably up to 5% by weight. The lower limit of gasoline swelling is not critical, but is usually at least 0.5% by weight.

Second Embodiment

While the first embodiment described above relies on the protective material consisting of a single fluorochemical gel material, the second embodiment differs therefrom in that the protective material consists of two species of material having different modulus of elasticity due to different crosslinking density.

Figure 2:
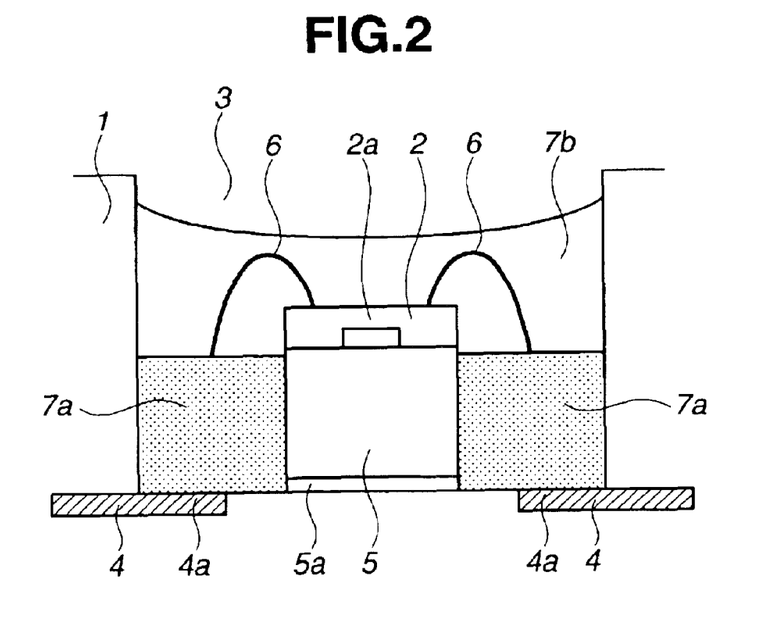
FIG. 2 illustrates an elevational cross-section of a semiconductor pressure sensor device according to a second embodiment of the invention.

Referring to FIG. 2, there is illustrated in elevational cross-section a semiconductor pressure sensor device according to the second embodiment of the invention. Since the second embodiment contains the same elements in substantially the same configuration as in the first embodiment except for the above difference, like parts in FIGS. 1 and 2 are designated by the same numerals for the sake of brevity of description.

In the device of the second embodiment, the protective material 7 filled in the cavity 3 for covering the sensor chip 2 and bonding wires 6 has a two-layer structure consisting of a first protective material 7a on the lower layer side (cavity bottom side) and a second protective material 7b on the upper layer side (cavity opening side).

The first protective material 7a on the lower layer side is a fluorochemical adhesive rubber material having electrical insulation and a relatively high modulus of elasticity as demonstrated by a Durometer A hardness of 5 to 35.

The first protective material 7a covers the exposed portions of the insert pins 4 within the cavity 3 (i.e., bonding pads 4a) and adjoining portions, glass pedestal 5 and the connections between bonding wires 6 and pads 4a while the sensitive portion of the sensor chip 2 is left uncovered or exposed.

The second protective material 7b on the upper layer side is a material having electrical insulation and a relatively low modulus of elasticity, that is, a fluorochemical gel material having a penetration equivalent to the protective material 7 in the first embodiment.

The second protective material 7b is disposed so as to cover the first protective material 7a, the sensitive portion and sides of the sensor chip 2, and the connections between bonding wires 6 and sensor chip 2. Then the bonding wires 6 are covered for protection with both the first and second protective materials 7a and 7b.

In the second embodiment, the cavity 3 is fully filled with the protective material 7 such that the first protective material 7a covers at least the inert pins 4 and surrounding portions with the sensitive portion of the sensor chip 2 being exposed, and the second protective material 7b covers the sensitive portion of the sensor chip 2, and the bonding wires 6 are covered for protection with the first and second protective materials 7a and 7b. In both the first and second embodiments, the filling of the protective material(s) is carried out by application and heat curing.

In the two-layer structure, a rubber composition to form the first protective material 7a may be cured or uncured before a curable composition to form the second protective material 7b is poured into the cavity 3. For preventing bubbles from generating from the interface between the first and second protective materials 7a and 7b, it is preferred that a curable composition to form the second protective material 7 be poured before the rubber composition is cured and both the compositions be heat cured at the same time.

The protective material 7 in the second embodiment, that is, the first and second protective materials 7a and 7b should have a Tg of up to −45° C. (embrittlement temperature up to −20° C.) and a degree of saturation swelling in gasoline at 23° C. of up to 7% by weight as in the first embodiment, with their preferred ranges being also the same.

Thus the second embodiment also prevents the generation of bubbles from within the protective material 7 under a negative pressure at a high temperature, due to gasoline, moisture and the like in the environment and the generation of bubbles caused by shortage of adhesive strength of the protective material 7b (gel material) at a negative pressure or low temperature.

Where the resinous housing 1 has been molded over the insert pins 4 by an insert molding technique, there is a possibility that a trace amount of air is trapped in voids between the housing 1 and the insert pins 4. If so, the air trapped in voids can be drawn into the protective material under the impetus of heat or pressure, to generate bubbles. In the second embodiment wherein the first protective material 7a covering the voids is a material having a relatively high modulus of elasticity, the generation of bubbles from the voids is effectively prohibited.

The first protective material 7a is disposed with the diaphragm 2a of the sensor chip 2 exposed, and that diaphragm 2a is covered with the second protective material 7b in the form of a gel material having a relatively low modulus of elasticity. This configuration achieves a satisfactory insulating/protecting function without interfering with the sensing function of the sensor chip 2.

The second embodiment only requires that the first protective material 7a be disposed so as to cover at least the insert pins 4 and surrounding portions. Between the first and second protective materials 7a and 7b, a third layer having an intermediate level of hardness may be interleaved. In this modified embodiment, the third layer should also have a Tg of up to −45° C. (embrittlement temperature up to −20° C.) and a degree of saturation swelling in gasoline at 23° C. of up to 7% by weight.

Although in the illustrated embodiments, the invention has been described as being applied to a semiconductor pressure sensor device for measuring an automotive engine intake air pressure, the invention is not limited to this application. The sensor device of the invention is applicable where a wide range of use temperature, chemical resistance and solvent resistance are required. The invention is widely applicable as a pressure sensor device for detecting the pressure of an intake or exhaust system of an internal combustion engine using gasoline, light oil or the like. The semiconductor pressure sensor is not limited to the chip having a diaphragm as the sensitive portion as in the illustrated embodiments and applicable to, for example, sensors based on capacitance and piezoelectric elements.

Now the fluorochemical gel material and fluorochemical rubber material are described in detail. The fluorochemical rubber material should have a hardness of 5 to 35, especially 5 to 30, according to JIS K6253. The fluorochemical gel material should have a penetration of 30 to 60 as measured by the consistency test of JIS K2220 using a ¼ cone. Both the fluorochemical rubber material and the fluorochemical gel material should have a glass transition temperature of up to −45° C. and a degree of saturation swelling in gasoline at 23° C. of up to 7% by weight.

The fluorochemical gel material is preferably a cured product of a curable composition comprising components (A) to (E):

(A) 100 parts by weight of a chain-like polyfluorodialkenyl compound having an alkenyl group at each end of a molecular chain and containing a backbone skeleton represented by the formula:

(B) 40 to 160 parts by weight of a chain-like polyfluoromonoalkenyl compound having an alkenyl group at one end of a molecular chain and containing a backbone skeleton represented by the formula:

(C) a fluorinated organosilicon compound having at least two hydrosilyl groups in a molecule, in an amount to give 0.8 to 1.2 equivalents of hydrosilyl groups based on entire alkenyl groups in components (A) and (B),

(D) a catalytic amount of a platinum group compound, and (E) up to 40 parts by weight of a non-functional perfluoropolyether per 100 parts by weight of components (A) and (B) combined.

The curable composition is poured and then heat cured (typically, by heating at 120 to 150° C. for one hour) whereby the cavity 3 is filled with the cured composition.

The fluorochemical rubber material is preferably a cured product of a curable composition comprising components (A), (C), (D), (E), (F) and (G):

(A) 100 parts by weight of a chain-like polyfluorodialkenyl compound having an alkenyl group at each end of a molecular chain and containing a backbone skeleton represented by the formula:

(C) a fluorinated organosilicon compound having at least two hydrosilyl groups in a molecule, in an amount to give 0.8 to 1.5 equivalents of hydrosilyl groups based on the entire alkenyl groups in component (A), (D) a catalytic amount of a platinum group compound, (E) up to 40 parts by weight of a non-functional perfluoropolyether, (F) 1 to 5 parts by weight of hydrophobic finely divided silica, and (G) 0.1 to 3.0 parts by weight of an organosilicon compound having at least one trialkoxysilyl and/or epoxy group in a molecule.

In addition to the above components, the composition for the fluorochemical rubber material optionally comprises (H) 0.1 to 0.5 part by weight of a carboxylic acid anhydride per 100 parts by weight of component (A).

The rubber composition is applied and then heat cured (typically, by heating at 120 to 150° C. for one hour) whereby the cavity 3 is partially filled with the cured rubber. The housing is generally made of PBT or PPS. In case the housing is made of PBT, the rubber composition absent component (H) bonds thereto. In case the housing is made of PPS, the rubber composition absent component (H) does not bond thereto.

Preferably component (A) is a chain-like polyfluorodialkenyl compound having side chains represented by the general formula (1).

$$CH_2=CH-(X)_a-Rf^1-(X')_a-CH=CH_2 \quad (1)$$

Herein X is a divalent group represented by —CH$_2$—, —CH$_2$O—, —CH$_2$OCH$_2$— or —Y—NR$^1$—CO— wherein Y is a divalent group represented by —CH$_2$— or and R$^1$ is hydrogen or a substituted or unsubstituted monovalent hydrocarbon group, X' is a divalent group represented by —CH$_2$—, —OCH$_2$—, —CH$_2$OCH$_2$— or —CO—NR$^1$—Y'— wherein Y' is a divalent group represented by —CH$_2$— or and R$^1$ is as defined above, and "a" is independently equal to 0 or 1.

Rf$^1$ is a divalent group having the general formula (i) or (ii).

(i)

Herein p and q each are an integer of at least 1, the sum of p and q on average is 2 to 200, and r is an integer of 0 to 6.

(ii)

Herein u is an integer of 1 to 200, and v is an integer of 1 to 50.

R$^1$ involved in X or X' is hydrogen or a substituted or unsubstituted monovalent hydrocarbon group, preferably having 1 to 12 carbon atoms, more preferably 1 to 10 carbon atoms. Suitable monovalent hydrocarbon groups include alkyl groups such as methyl, ethyl, propyl, butyl, hexyl, cyclohexyl and octyl, aryl groups such as phenyl and tolyl, aralkyl groups such as benzyl and phenylethyl, and substituted monovalent hydrocarbon groups in which some or all of the hydrogen atoms are substituted with halogen atoms such as fluorine.

The following groups are illustrative of Rf$^1$ group, with divalent groups of the first formula being preferred.

Herein m and n each are an integer of at least 1, and an average of m+n is 2 to 200.

Herein m is an integer of 1 to 200, and n is an integer of 1 to 50.

Illustrative, non-limiting examples of the polyfluorodialkenyl compound having formula (1) are given below.

Herein m and n each are an integer of at least 1, and an average of m+n is 2 to 200.

The polyfluorodialkenyl compound having formula (1) should preferably have a viscosity in the range of 5 to 100,000 mPa·s at 23° C. because its cured product have appropriate physical properties. Depending on a particular application, a polyfluorodialkenyl compound having a most appropriate viscosity within the range may be selected.

Component (B) is preferably a chain-like polyfluoromonoalkenyl compound having side chains represented by the general formula (2).

Herein X' and "a" are as defined above, $Rf^2$ is a group of the general formula (iii):

wherein w is an integer of at least 1, which is smaller than any of the sum of p+q (average) and r and the sum of u and v for $Rf^1$ in formula (1).

The definition of w in $Rf^2$ group in relation to $Rf^1$ group in the polyfluorodialkenyl compound as component (A) is essential for the inventive composition to form a low-bleeding cured product.

Illustrative, non-limiting examples of the polyfluoromonoalkenyl compound having formula (2) are given below.

$\overline{m} = 10, \overline{n} = 6$ m = 1 to 200

Note that m is an integer of 1 to 200, satisfying the requirement of w.

An appropriate amount of the polyfluoromonoalkenyl compound (B) added is 40 to 160 parts by weight, preferably 50 to 150 parts by weight per 100 parts by weight of the polyfluorodialkenyl compound (A). Like the polyfluorodialkenyl compound, the polyfluoromonoalkenyl compound should preferably have a viscosity in the range of 5 to 100,000 mPa·s at 23° C.

Component (C) is an organohydrogensiloxane having at least two hydrogen atoms each attached to a silicon atom (i.e., Si—H groups) in a molecule. It serves as a crosslinker and chain extender for components (A) and (B). For compatibility and dispersion with components (A) and (B) and cured uniformity, component (C) should preferably have at least one fluorinated group in a molecule.

The fluorinated groups include, for example, groups of the following general formulae.

Herein s' is an integer of 1 to 20, preferably 2 to 10.

Herein n is an integer of 2 to 200, preferably 2 to 100.

Herein t is an integer of 1 to 20, preferably 2 to 10.

Herein m and n each are an integer of at least 1, and an average of m+n is 2 to 200, preferably 2 to 100.

Examples of the organohydrogensiloxane compound having a fluorinated group (C) are given below. These compounds may be used alone or in admixture of two or more. Note that Me is methyl and Ph is phenyl.

-continued a+b = 3, a = 1, 2, b = 1, 2 n = 24 a+b = 2, Rf: F—(CFCF₂O)ₙ—CF—  n = 50

-continued n = 1 to 50, m = 1 to 50, n+m = 2 to 50 n = 1 to 50, m = 1 to 50, n+m = 2 to 50 n = 3 to 50 n = 3 to 50 n = 3 to 50 n = 3 to 50

-continued n = 1 to 50, m = 1 to 50, $\overline{n+m}$ = 2 to 50

Component (C) is used in an effective amount for the inventive composition to cure, and preferably such that 0.8 to 1.5 equivalents of hydrosilyl (Si—H) groups in component (C) are available per equivalent of alkenyl groups in components (A) and (B) in the composition. Less amounts of hydrosilyl groups may lead to a lower degree of crosslinking, resulting in undercure. More amounts of hydrosilyl groups can cause foaming during the cure.

Component (D) is a platinum group metal catalyst for promoting the addition reaction between alkenyl groups in components (A) and (B) and hydrosilyl groups in component (C). Of these catalysts, platinum compounds which are relatively easily available are often employed. The platinum compounds include, for example, chloroplatinic acid, complexes of chloroplatinic acid with olefins such as ethylene, alcohols and vinylsiloxanes, and metallic platinum on silica, alumina or carbon, though not limited thereto. Known examples of the platinum group compounds other than the platinum compound are rhodium, ruthenium, iridium and palladium compounds, for example, $RhCl(PPh_3)_3$, $RhCl(CO)(PPh_3)_2$, $Ru_3(CO)_{12}$, $IrCl(CO)(PPh_3)_2$, and $Pd(PPh_3)_4$ wherein Ph is phenyl.

The catalyst is used in a catalytic amount. Usually, the preferred amount of the catalyst is about 0.1 to 100 parts by weight of platinum group metal per million parts by weight of components (A), (B) and (C) combined.

Component (E) is a non-functional perfluoropolyether, preferably at least one non-functional perfluoropolyether selected from compounds having the general formulae (3) to (5).

$$A-O-(CF_2CF_2CF_2O)_c-A \qquad (3)$$

Herein A is independently a group of the formula: $CF_3-$, $C_2F_5-$ or $C_3F_7-$, and c is an integer of 1 to 200, which is smaller than any of the sum of p+q (average) and r, the sum of s+t (average) and r, and the sum of u and v for $Rf^1$ in formula (1) (i.e., c<p+q+r, c<s+t+r and c<u+v).

$$A-O-(CF_2)_d(CF_2CF_2O)_e-A \qquad (4)$$

Herein A is as defined above, d and e each are an integer of 1 to 200, and the sum of d and e is equal to or smaller than any of the sum of p+q (average) and r, the sum of s+t (average) and r, and the sum of u and v for $Rf^1$ in formula (1) (i.e., d+e≦p+q+r, d+e≦s+t+r and d+e≦u+v).

$$A-O-(CF_2O)_d[CF_2CF(CF_3)O]_f-A \qquad (5)$$

Herein A is as defined above, d and f each are an integer of 1 to 200, and the sum of d and f is equal to or smaller than any of the sum of p+q (average) and r, the sum of s+t (average) and r, and the sum of u and v for $Rf^1$ in formula (1) (i.e., d+f≦p+q+r, d+f≦s+t+r and d+f≦u+v).

The amount of the non-functional perfluoropolyether (E) compounded is up to 40 parts by weight, preferably 5 to 40 parts by weight, more preferably 5 to 35 parts by weight, per 100 parts by weight of components (A) and (B) combined.

Component (F) is hydrophobic finely divided silica, which is obtained by effecting hydrophobic treatment on finely divided silica having a BET specific surface area of at least 50 m²/g that is well known as the filler for silicone rubber. Examples of the finely divided silica include fumed silica, precipitated silica, and colloidal silica, with the fumed silica being most preferred. The finely divided silica should preferably have a BET specific surface area of at least 50 m²/g, more preferably 100 to 400 m²/g. Examples of the hydrophobic treating agent for finely divided silica include organochlorosilanes, organodisilazanes, cyclic organopolysilazanes, linear organopolysiloxanes, and cyclic organopolysiloxanes, with the organochlorosilanes and organodisilazanes being preferred. Preferably, the silica powder has been treated to be hydrophobic prior to addition to the composition.

Component (F) is compounded in an amount of 1 to 5 parts by weight per 100 parts by weight of component (A). If the amount of component (F) in the rubber composition is less than 1 part, it becomes impossible to form a two-layer structure by simultaneously heat curing the rubber composition and the gel composition because both the compositions are miscible with each other. If the amount of component (F) is more than 5 parts, the rubber composition becomes less flowable, leading to the difficulty of self leveling. In addition, the cured product has an increased hardness, which can cause breakage of bonding wires during pressure sensor operation.

Component (G) is an organosilicon compound having at least one trialkoxysilyl and/or epoxy group in a molecule. Examples are compounds of the following structural formulae. These compounds may be used alone or in admixture.

(Letters o, q and r are positive integers, and p is an integer inclusive of 0.)

$\overline{n+m} = 3 \text{ to } 50$ (Letters o, q and r are positive integers, and p is an integer inclusive of 0.)

The amount of component (G) used is 0.1 to 3.0 parts by weight, preferably 0.2 to 2.5 parts by weight per 100 parts by weight of component (A). Less than 0.1 part of component (G) fails to provide sufficient adhesion. More than 3.0 parts of component (G) adversely affects the fluidity of the composition to hinder the extrusion thereof from a dispenser and also reduces the physical strength of a cured product.

Component (H) is a carboxylic acid anhydride which is selected from those commonly used as the curing agent for epoxy resins. Exemplary carboxylic anhydrides are given below.

(HHPA)  (MeTHPA)

(MeHHPA)

(PMDA)

-continued (BTDA)

(DDSA)

Of these, the most preferred anhydrides are BTDA and

The amount of component (H) used is 0.1 to 0.5 part by weight per 100 parts by weight of component (A). Less than 0.1 part of component (H) may fail to provide sufficient adhesion promoting effect whereas more than 0.5 part of component (H) may adversely affect the physical properties of a cured product and tends to generate bubbles upon curing.

In addition to the above-described components, the compositions of the invention may further contain various additives. Such optional components include regulators for hydrosilylation catalysts, for example, acetylene alcohols such as 1-ethynyl-1-hydroxycyclohexane, 3-methyl-1-butyn-3-ol, 3,5-dimethyl-1-hexyn-3-ol, 3-methyl-1-penten-3-ol, and phenylbutynol, 3-methyl-3-penten-1-yne, 3,5-dimethyl-3-hexen-1-yne, etc., polymethylvinylsiloxane cyclic compounds, and organic phosphorus compounds. These regulators are effective for maintaining curing reactivity and storage stability appropriate. Other optional components include inorganic fillers, for example, iron oxide, zinc oxide, titanium oxide, calcium carbonate, magnesium carbonate, zinc carbonate, and carbon black. By adding such inorganic fillers to the inventive compositions, the hardness and mechanical strength of gel or rubber-like cured products can be adjusted. There may be added hollow inorganic fillers and spherical rubbery fillers as well. The amounts of these optional components added are arbitrary insofar as they do not compromise the properties of the compositions and the physical properties of cured products.

EXAMPLE

Examples of the invention are given below by way of illustration and not by way of limitation. Parts are by weight. Viscosity is in centistoke (cSt) at 23° C.

Preparation Example 1

In 100 parts of a polymer having formula A-1 (viscosity 2,100 cSt) and 33 parts of a polymer having formula E-1, 1.5 parts of Aerosil R-976 (Nippon Aerosil Co., Ltd.) was compounded. This was combined with 0.3 part of a 50% toluene solution of ethynyl cyclohexanol, 0.2 part of a toluene solution containing a vinylsiloxane complex of chloroplatinic acid (platinum metal concentration 0.5 wt %), 6.2 parts of a compound having formula C-1, 1.5 parts of a compound having formula C-2, and 1.5 parts of a compound having formula G-1. These components were uniformly mixed to form a rubber composition 1.

The composition was press molded at 150° C. for 10 minutes and post-cured at 150° C. for 50 minutes, yielding a rubber material 1. The physical properties (hardness, tensile strength and elongation) of the cured part were measured according to JIS K6249. The degree of saturation swelling in gasoline (using unleaded gasoline) was measured according to JIS K6258 under immersion conditions: 23° C. and 168 hours. The glass transition temperature (Tg) was measured by a differential scanning calorimeter (DSC). The results are shown in Table 1.

Preparation Examples 2–7

Rubber compositions 2 to 7 were prepared as in Preparation Example 1. The compounds used herein were identical or analogous to compounds A-1, C-1, C-2, E-1, G-1 and Aerosil R-976 used in Preparation Example 1, and they were used in the proportion shown in Table 1. Compound H was added in Preparation Example 5.

As in Preparation Example 1, the compositions were determined for rubber physical properties, degree of saturation swelling in gasoline, and Tg. The results are also shown in Table 1.

Preparation Example 8

To 65 parts of a polymer having formula A-2 (viscosity 5,600 cSt) and 35 parts of a polymer having formula B (viscosity 650 cSt) were added 30 parts of a polymer having formula E-1, 0.15 part of a 50% toluene solution of ethynyl cyclohexanol, 0.015 part of an ethanol solution containing a vinylsiloxane complex of chloroplatinic acid (platinum metal concentration 3.0 wt %), and 20 parts of a compound having formula C-5. These components were uniformly mixed to form a gel composition 1.

The composition was heated at 150° C. for one hour, yielding a gel material 1. The penetration of this gel-like cured product was measured according to the consistency test of JIS K2220 (¼ cone). The degree of saturation swelling in gasoline and Tg were measured as in Preparation Example 1. The results are shown in Table 2.

Preparation Examples 9–15

Gel compositions 2 to 8 were prepared as in Preparation Example 8. The compounds used herein were identical or analogous to compounds A-2, B, C-5 and E-1 used in Preparation Example 8, and they were used in the proportion shown in Table 2.

As in Preparation Example 8, the penetration, degree of saturation swelling in gasoline, and Tg of the compositions were determined. The results are also shown in Table 2.

TABLE 1

| Rubber composition | 1 | 2 | 3 | 4 | 5 | 6 | 7 | Pbw |
|---|---|---|---|---|---|---|---|---|
| Component (A) | A-1(100) | A-1(100) | A-2(100) | A-2(100) | A-2(100) | A-1(100) | A-2(100) | |
| Component (C) | C-1(6.2) | C-1(6.2) | C-1(1.9) | C-2(1.1) | C-2(1.1) | C-1(6.7) | C-2(1.0) | |
| | C-2(1.5) | C-2(1.5) | C-2(1.5) | C-3(1.7) | C-3(1.7) | C-2(1.4) | C-3(2.0) | |
| Component (E) | E-1(30) | E-2(15) | | E-1(25) | E-1(25) | | E-1(30) | |
| Component (F) | R-976 (1.5) | R-976 (2.0) | R-976 (1.5) | R-972 (4.0) | R-972 (2.4) | R-976 (2.5) | R-972 (0.5) | |
| Component (G) | G-1(1.5) | G-1(1.5) | G-1(1.0) | G-2(2.5) | G-2(2.5) | G-1(1.5) | G-2(2.0) | |
| Component (H) | | | | | 0.3 | | | |
| Hardness (Durometer A) | 25 | 30 | 28 | 18 | 13 | 39 | 4 | |
| Tensile strength (MPa) | 0.5 | 0.7 | 0.8 | 0.8 | 0.5 | 0.8 | 0.2 | |
| Elongation (%) | 160 | 140 | 190 | 250 | 240 | 100 | 290 | |
| Gasoline swelling (%) | 4.2 | 4.8 | 3.4 | 2.8 | 3.0 | 5.0 | 2.9 | |
| Tg (° C.) | −72 | −49 | −50 | −72 | −73 | −49 | −74 | |

TABLE 2

| Gel composition | 1 | 2 | 3 | 4 | 5 | 6 | 7 | 8 | Pbw |
|---|---|---|---|---|---|---|---|---|---|
| Component (A) | A-2(65) | A-2(64) | A-2(63) | A-2(60) | A-2(59) | A-1(42) | A-2(57) | A-2(45) | |
| Component (B) | B(35) | B(36) | B(37) | B(40) | B(41) | B(58) | B(43) | B(55) | |
| Component (C) | C-5(20) | C-5(20) | C-5(22) | C-5(23) | C-5(23) | C-4(14) | C-5(23) | C-5(24) | |
| Component (E) | E-1(30) | E-1(10) | E-1(30) | E-1(30) | E-1(30) | E-2(20) | E-1(30) | E-1(30) | |
| Hardness (penetration) | 20 | 27 | 34 | 41 | 50 | 56 | 67 | 96 | |
| Gasoline swelling (%) | 3.4 | 3.7 | 3.6 | 3.8 | 3.8 | 5.2 | 3.9 | 4.1 | |
| Tg (° C.) | −78 | −61 | −78 | −77 | −77 | −51 | −77 | −77 | |

Example 1

Semiconductor pressure sensor devices were fabricated according to the first embodiment shown in FIG. 1. The cavity 3 was filled with a gel material as shown in Table 3 as the protective material 7 so that the sensor chip 2 and bonding wires 6 were completely covered therewith. The sensor samples were immersed in gasoline or water for one week and then taken out.

Each sensor sample was subjected to a dual load test under the pressure and thermal cycling conditions shown below. After million cycles in terms of pressure cycling, the sample was observed for bubble generation and crack formation in the gel material, breakage of bonding wires, and liquefaction of the gel material. The results of evaluation are shown in Table 3.

Pressure cycling: 2,000 mmHg/2 sec⇌100 mmHg/2 sec
Thermal cycling: 150° C./60 min⇌−40° C./60 min

Example 2

Semiconductor pressure sensor devices were fabricated according to the second embodiment shown in FIG. 2. The cavity 3 was filled with a rubber material 7a and a gel material 7b as shown in Tables 4 and 5 as the protective material 7 so that the sensor chip 2 and bonding wires 6 were completely covered with the protective material. The sensor samples were immersed in gasoline or water for one week and then taken out.

Each sensor sample was subjected to the same dual load test of pressure and thermal cycling as in Example 1. The sample was similarly observed. The results of evaluation are shown in Tables 4 and 5.

TABLE 3

| Gel composition | 1 | 2 | 3 | 4 | 5 | 6 | 7 | 8 |
|---|---|---|---|---|---|---|---|---|
| Hardness (penetration) | 20 | 27 | 34 | 41 | 48 | 56 | 67 | 95 |
| Bubbles | nil | a few | nil | nil | nil | nil | many | many |
| Cracks | found | found | nil | nil | nil | nil | found | found |
| Wire breakage | break | break | no | no | no | no | break | break |
| Liquefaction | no | no | no | no | no | no | found | found |

TABLE 4

| Gel composition | 3 | 3 | 3 | 3 | 3 | 3 | 3 |
|---|---|---|---|---|---|---|---|
| Hardness (penetration) | 34 | 34 | 34 | 34 | 34 | 34 | 34 |
| Rubber composition | 1 | 2 | 3 | 4 | 5 | 6 | 7 |
| Hardness (Durometer A) | 25 | 30 | 28 | 18 | 13 | 39 | 4 |
| Bubbles | nil | nil | nil | nil | nil | found | a few |
| Cracks | nil | nil | nil | nil | nil | found | found |
| Wire breakage | no | no | no | no | no | break | break |
| Liquefaction (gelation) | no | no | no | no | no | no | no |
| Housing material | PBT | PBT | PBT | PBT | PPS | PBT | PBT |

TABLE 5

| Gel composition | 5 | 5 | 5 | 5 | 5 | 5 | 5 |
|---|---|---|---|---|---|---|---|
| Hardness (penetration) | 48 | 48 | 48 | 48 | 48 | 48 | 48 |
| Rubber composition | 1 | 2 | 3 | 4 | 5 | 6 | 7 |
| Hardness (Durometer A) | 25 | 30 | 28 | 18 | 13 | 39 | 4 |
| Bubbles | nil | nil | nil | nil | nil | found | found |
| Cracks | nil | nil | nil | nil | nil | found | found |
| Wire breakage | no | no | no | no | no | break | break |
| Liquefaction (gelation) | no | no | no | no | no | no | no |
| Housing material | PBT | PBT | PBT | PBT | PPS | PBT | PBT |

The semiconductor pressure sensor devices of the invention are effective for restraining bubble generation within the protective material even when they are not only subjected to varying pressure and varying temperature, but also exposed to an atmosphere containing gasoline vapor, water vapor, acidic exhaust gases or the like. The sensor devices are improved in operation reliability and durability life.

Japanese Patent Application No. 2002-201366 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor pressure sensor device comprising a housing having a cavity, a semiconductor sensor chip mounted within the cavity for detecting a pressure to produce a signal, leads for conveying the signal, and bonding wires providing electrical connection between said sensor chip and said leads, wherein a sensitive portion of said sensor chip, said leads and said bonding wires are covered and protected with an electrically insulating fluorochemical gel material, said fluorochemical gel material having a penetration of 30 to 60 as measured by the consistency test of JIS K2220 using a ¼ cone, a glass transition temperature of up to −45° C., and a degree of saturation swelling in gasoline at 23° C. of up to 7% by weight.

2. The semiconductor pressure sensor device of claim 1 wherein said fluorochemical gel material is a cured product of a curable composition comprising components (A) to (E):

(A) 100 parts by weight of a chain-like polyfluorodialkenyl compound having an alkenyl group at each end of a molecular chain and containing a backbone skeleton represented by the formula:

(B) 40 to 160 parts by weight of a chain-like polyfluoromonoalkenyl compound having an alkenyl group at one end of a molecular chain and containing a backbone skeleton represented by the formula:

(C) a fluorinated organosilicon compound having at least two hydrosilyl groups in a molecule, in an amount to give 0.8 to 1.2 equivalents of hydrosilyl groups based on the entire alkenyl groups in components (A) and (B), (D) a catalytic amount of a platinum group compound, and (E) up to 40 parts by weight of a non-functional perfluoropolyether per 100 parts by weight of components (A) and (B) combined.

3. A semiconductor pressure sensor device comprising a housing having a cavity, a semiconductor sensor chip mounted within the cavity for detecting a pressure to produce a signal, leads embedded in the housing by insert molding for conveying the signal, and bonding wires providing electrical connection between said sensor chip and said leads, wherein at least said leads and surrounding portions are covered with an electrically insulating fluorochemical rubber material while a sensitive portion of said sensor chip is exposed, said fluorochemical rubber material and the sensitive portion of said sensor chip are covered with an electrically insulating fluorochemical gel material, and said bonding wires are covered with said fluorochemical rubber material and said fluorochemical gel material, said fluorochemical rubber material having a hardness of 5 to 35 according to JIS K6253, said fluorochemical gel material having a penetration of 30 to 60 as measured by the consistency test of JIS K2220 using a ¼ cone, said fluorochemical rubber material and said fluorochemical gel material both having a glass transition temperature of up to −45° C. and a degree of saturation swelling in gasoline at 23° C. of up to 7% by weight.

4. The semiconductor pressure sensor device of claim 3 wherein a member through which said semiconductor sensor chip is mounted to the housing is also covered with said fluorochemical rubber material.

5. The semiconductor pressure sensor device of claim 3 wherein said fluorochemical rubber material is a cured product of a curable composition comprising components (A), (C), (D), (E), (F) and (G), and said fluorochemical gel material is a cured product of a curable composition comprising components (A), (B), (C), (D) and (E):

(A) 100 parts by weight of a chain-like polyfluorodialkenyl compound having an alkenyl group at each end of a molecular chain and containing a backbone skeleton represented by the formula:

(B) 40 to 160 parts by weight of a chain-like polyfluoromonoalkenyl compound having an alkenyl group at one end of a molecular chain and containing a backbone skeleton represented by the formula:

(C) a fluorinated organosilicon compound having at least two hydrosilyl groups in a molecule, in an amount to give 0.8 to 1.5 equivalents of hydrosilyl groups based on the entire alkenyl groups in components (A) and (B), (D) a catalytic amount of a platinum group compound, (E) up to 40 parts by weight of a non-functional perfluoropolyether per 100 parts by weight of components (A) and (B) combined, (F) 1 to 5 parts by weight of hydrophobic finely divided silica, and

(G) 0.1 to 3.0 parts by weight of an organosilicon compound having at least one trialkoxysilyl and/or epoxy group in a molecule.

6. The semiconductor pressure sensor device of claim 5 wherein said fluorochemical rubber material is a cured product of the curable composition further comprising (H) 0.1 to 0.5 part by weight of a carboxylic acid anhydride per 100 parts by weight of component (A).

7. The semiconductor pressure sensor device of claim 2 wherein component (A) is a chain-like polyfluorodialkenyl compound having side chains represented by the general formula (1):

$$CH_2=CH-(X)_a-Rf^1-(X')_a-CH=CH_2 \qquad (1)$$

wherein X is a divalent group represented by —$CH_2$—, —$CH_2O$—, —$CH_2OCH_2$— or —Y—$NR^1$—CO— wherein Y is a divalent group represented by —$CH_2$— or and $R^1$ is hydrogen or a substituted or unsubstituted monovalent hydrocarbon group, X' is a divalent group represented by —$CH_2$—, —$OCH_2$—, —$CH_2OCH_2$— or —CO—$NR^1$—Y'— wherein Y' is a divalent group represented by —$CH_2$— or and $R^1$ is as defined above, "a" is independently equal to 0 or 1, $Rf^1$ is a divalent group having the general formula (i):

$$-CF(CF_3)-[OCF_2CF(CF_3)]_p-O-CF_2(CF_2)_rCF_2-O-[CF(CF_3)CF_2O]_q-CF(CF_3)- \qquad (i)$$

wherein p and q each are an integer of at least 1, the sum of p and q on average is 2 to 200, and r is an integer of 0 to 6, or the general formula (ii):

$$-CF(CF_3)-[OCF_2CF(CF_3)]_u-(OCF_2)_v-OCF(CF_3)- \qquad (ii)$$

wherein u is an integer of 1 to 200, and v is an integer of 1 to 50.

8. The semiconductor pressure sensor device of claim 2 wherein component (B) is a chain-like polyfluoromonoalkenyl compound having side chains represented by the general formula (2):

$$Rf^2-(X')_a-CH=CH_2 \qquad (2)$$

wherein X' and "a" are as defined above, $Rf^2$ is a group of the general formula (iii):

$$F-[CF(CF_3)CF_2O]_w-CF(CF_3)- \qquad (iii)$$

wherein w is an integer of at least 1, which is smaller than any of the sum of p+q (average) and r and the sum of u and v for $Rf^1$ in formula (1).

9. The semiconductor pressure sensor device of claim 2 wherein component (E) is at least one non-functional perfluoropolyether selected from the group consisting of compounds having the general formulae (3) to (5):

$$A-O-(CF_2CF_2CF_2O)_c-A \qquad (3)$$

wherein A is independently $CF_3$—, $C_2F_5$— or $C_3F_7$—, and c is an integer of 1 to 200, which is smaller than any of the sum of p+q (average) and r, the sum of s+t (average) and r, and the sum of u and v for $Rf^1$ in formula (1), $$A-O-(CF_2O)_d(CF_2CF_2O)_e-A \qquad (4)$$

wherein A is as defined above, d and e each are an integer of 1 to 200, and the sum of d and e is equal to or smaller than any of the sum of p+q (average) and r, the sum of s+t (average) and r, and the sum of u and v for $Rf^1$ in formula (1), $$A-O-(CF_2O)_d[CF_2CF(CF_3)O]_f-A \qquad (5)$$

wherein A is as defined above, d and f each are an integer of 1 to 200, and the sum of d and f is equal to or smaller than any of the sum of p+q (average) and r, the sum of s+t (average) and r, and the sum of u and v for $Rf^1$ in formula (1).

* * * * *